(12) United States Patent
Schuh et al.

(10) Patent No.: US 6,232,701 B1
(45) Date of Patent: May 15, 2001

(54) PIEZOELECTRIC COMPONENT AND METHOD FOR THE MANUFACTURE THEREOF

(75) Inventors: Carsten Schuh, Baldham; Karl Lubitz, Ottobrunn; Dieter Cramer, Graz, all of (DE)

(73) Assignees: Siemens Aktiengesellschaft; EPCOS AG, both of Munich (DE)

(*) Notice: Subject to any disclaimer, the term of this patent is extended or adjusted under 35 U.S.C. 154(b) by 0 days.

(21) Appl. No.: 09/470,384

(22) Filed: Dec. 22, 1999

(30) Foreign Application Priority Data

Dec. 23, 1998 (DE) .............................. 198 60 001

(51) Int. Cl.[7] ................ H02N 310/328; H02N 310/364; H02N 310/369; H02N 310/320
(52) U.S. Cl. .................... 310/328; 310/364; 310/369; 310/320.34
(58) Field of Search .................. 310/328, 369, 310/368, 364

(56) References Cited

U.S. PATENT DOCUMENTS

| | | | | |
|---|---|---|---|---|
| 3,564,463 | * | 2/1971 | Beaver | 310/328 |
| 4,356,421 | * | 10/1982 | Shimizu | 310/368 |
| 4,918,350 | * | 4/1990 | Audo | 310/358 |
| 5,245,734 | * | 9/1993 | Issartel | 310/328 |

FOREIGN PATENT DOCUMENTS

| | | |
|---|---|---|
| 39 40 619 A1 | 12/1989 | (DE) . |
| 196 05 214 A1 | 2/1996 | (DE) . |
| 196 15 694 C1 | 4/1996 | (DE) . |
| 197 15 487 A1 | 4/1997 | (DE) . |
| 5-267743 | 10/1993 | (JP) . |

OTHER PUBLICATIONS

Article entitled: "AG Doping of Rare EArth Modified PZT", *Proceedings Electroceramics V*, Editors: J.L. Baptista, J.A. Labrincha, P.M. Vilarinho, Aviero (Portugal), Sep. 2–4, 1996, Book 1, pp. 201–204.

* cited by examiner

*Primary Examiner*—Nestor Ramirez
*Assistant Examiner*—Karen Addison
(74) *Attorney, Agent, or Firm*—Schiff Hardin & Waite

(57) ABSTRACT

A piezoelectric component in the form an actuator having a monolithic multi-layer stack is disclosed. The stack comprises a large active cross sectional area and simultaneously exhibits high arc-over resistance between neighboring electrodes of different polarity. For manufacture, only the surface of the stack via which an electrical contacting of the electrode layers ensues is ground after the sintering of a stack composed of piezo ceramic layers and electrode layers arranged on top of one another.

17 Claims, 2 Drawing Sheets

PIEZOELECTRIC COMPONENT AND METHOD FOR THE MANUFACTURE THEREOF

FIELD OF THE INVENTION

The present invention relates generally to piezoelectric components and, more specifically, piezoelectric components including multiple layers of ceramic piezoelectric materials and electrode layers sandwiched between the ceramic layers. The present invention is also directed toward a method of manufacturing such a piezoelectric component.

BACKGROUND OF THE INVENTION

A piezoelectric component is composed, for example, of a piezo ceramic layer that has both sides provided with a metallic electrode layer. When a different electrical voltage is applied to these electrode layers, then the piezo ceramic layer reacts with a lattice distortion. As a result thereof, the component expands and contracts in a direction that is defined by the arrangement of the piezo ceramic layer and of electrode layers.

DE 196 15 694 discloses a piezoelectric component in the form of a piezo actuator in monolithic multilayer structure. The piezo actuator comprises a stack of alternating electrodes and piezo ceramic layers. One electrode layer serves each neighboring piezo ceramic layer as electrode. To that end, an electrical contacting of the electrode layers ensues in an alternating polarity. The alternating polarity is achieved with the assistance of two metalization strips that are laterally applied to the stack. One metalization strip extends over a height that derives from piezoelectrically active layers of the stack stacked on top of one another. The stack has a quadratic base area. The electrical contacting of the electrode layers ensues at opposite corners of the stack. The spacing from electrode to electrode of different polarity amounts to approximately 80 $\mu$m. One of the metalization strips is electrically conductively connected to each second eletrode layer and is insulated from each first electrode layer lying there between. By contrast thereto, the second metalization strip is insulated from every second electrode layer and is electrically conductively connected to each first electrode layer. An insulation of an electrode layer relative to a metalization is achieved in that the electrode layer comprises a recess in a region in which the metalization is applied. The piezo actuator is piezoelectrically inactive in this region since no lattice distortion can be produced here by applying a voltage.

It is important for the functionality of the described piezo actuator that each electrode layer is electrically contacted in the piezoelectrically inactive region. At the same time, it is important that an electrical arc-over or a short-circuit is avoided in a piezoelectrically active area. A lattice distortion occurs in the piezoelectrically active area by applying a voltage. An arc-over can occur between neighboring electrode layers or an electrode layer and an arbitrary electrode of the piezo actuator. A short-circuit can be produced, for example, by mechanical damage, contamination and an influence of atmospheric humidity and/or a fuel (diesel, oil, etc.).

SUMMARY OF THE INVENTION

An object of the invention is to disclose how, given a piezoelectric component, a reliable electrical contacting of every electrode layer can be produced and how an electrical arc-over between electrodes of different polarity can be avoided at the same time.

A piezoelectric component is provided for achieving this object. According to this solution, the component comprises a stack comprising at least two ceramic layers and: an electrode layer arranged between two ceramic layers, characterized in that an interspace that comprises an electrically insulating material is present between the ceramic layers.

The component is, for example, a piezo actuator comprising a stack that comprises a monolithic multi-layer composite of ceramic and electrode layers.

The underlying idea of the invention is comprised in specifying a piezoelectric component having an optimally large piezoelectrically active cross sectional area. A lattice distortion of the piezo ceramic occurs over this cross sectional area. At the same time, however, an electrical arc-over between electrode layers of different polarity should be avoided. This succeeds with the assistance of a recited interspace. The interspace is therefore preferably arranged in a piezoelectrically active region of the stack. The interspace increases an effective distance from electrode layer to electrode layer of different polarity. As a result thereof, for example, the probability is decreased that an electrical short will occur between the electrodes due to dirt.

In an embodiment, the interspace is open at one side. The interspace is located at one side of the stack, particularly at a side of the piezoelectrically active region of the stack.

In an embodiment, the interspace is arranged at a hole of the stack. The hole passes through the stack, particularly perpendicular to the layers of the stack. The hole can entirely or only partially pass through the stack.

The material of the interspace comprises, for example, a gas, particularly a dry gas.

In an embodiment, the material of the interspace comprises a plastic. The entire lateral surface of the stack is preferably provided with a protective layer of plastic. The material of the interspace is thereby a component part of the protective layer. The protective layer has the job of protecting the sensitive, piezoelectrically active surface of the piezo actuator against damage, contamination and the influence of atmospheric humidity and fuels. At the same time, the protective layer functions as insulator in an interspace.

A silicone elastomer is particularly suited as plastic. An elasticity of the protective layer in a wide temperature range from −40° C. through +150° C. is required, for example, for a use of the piezo actuator in a diesel injection system. This specification is met by a silicone elastomer.

In an embodiment, the stack has a ceramic layer that comprises a lead zirconate titanate (PZT, $PbZr_xTi_{1-x}O_3$). An electrode layer thereby particularly comprises a substance that is selected from the group of palladium and/or silver. An alloy of said substances having a ratio of palladium to silver of 30 to 70 is particularly advantageous. An electrode is also conceivable that comprises copper and/or nickel.

For achieving the object, a method for manufacturing a piezoelectric component is recited in addition to a piezoelectric component. Ceramic layers and electrode layers are arranged such to form a stack given the component to be manufactured that the layers terminate flush at a lateral surface of a piezoelectrically inactive region of the stack. The method is characterized by the following method steps: a) sintering a stack of at least two glean ceramic foils and an electrode layer arranged there between, and b) removing a material of a ceramic layer and/or of electrode layer at a lateral surface of the inactive region of the stack.

In an embodiment of the invention, the removal ensues by grinding. The grinding is implemented, for example, with a diamond grinding tool. A relative direction of the grinding can be freely selected with reference to a position of the layers of the stack.

In an embodiment, a lateral surface of the piezoelectrically active region remains in a condition as it was present after the sintering (as fired). This surface of the active region is thus not ground.

Before the sintering, a stack of green ceramic foils and electrode layers arranged there between is produced. A manufacture of this stack advantageously occurs in the panel [or: blank] (multi space up). Larger green ceramic foils and electrode layers are thereby arranged above one another to form a panel [or blank] stack. The individual stacks to be sintered are separated from this panel [or blank] stack. This ensues, for example, by cutting, punching or sawing. A smearing of electrode material at the lateral surfaces of the stack can thereby occur.

A combination of lead zirconate titanate ceramic and an electrode material is the form of an alloy of palladium and silver is especially advantageous. During the course of common sintering, the silver of the electrode material smeared at the surface of the stack is completely integrated into the lead zirconate titanate ceramic. Only palladium islands remain on the surface, their size being too small in order to be able to serve as a trigger for an electric arc-over. Due to integration of silver into the lead zirconate titanate ceramic as well as a modified grain growth at a free surface of an electrode material, an electrode layer pulls back somewhat from the lateral surface of the stack into the inside of the stack during the course of sintering (approximately 2–5 μm). An effective distance between two neighboring electrode layers of different polarity is therefore enlarged at the surface. An arc-over resistance increases, i.e. a probability for a short decreases. This effect can be further intensified by a specifically adapted sintering program.

Under a reducing sintering condition, some other electrode materials such as copper or nickel can be processed with comparable effect.

A piezoelectrical component, particularly a piezo actuator with a monolithic multilayer structure, can be manufactured with the method. Such a piezoelectrical component is employed for controlling an injection valve, particularly an injection valve of an internal combustion engine.

The following advantages are also united with the disclosed invention:

the piezoelectric component is distinguished by a large active cross sectional area. and is simultaneously distinguished by a high arc-over resistance in the piezoelectrically active area.

An electrode layer can be optimally electrically contacted. The surface of the piezoelectrically inactive region is only ground off. A roughness of the surface resulting therefrom improves an adhesion of a metalization on the surface.

A treatment of the surface of the piezoelectrically active regions such as polishing is foregone. As a result thereof, a number of method steps (polishing, cleaning steps) are eliminated in a manufacturing process. The method is simple and cost-beneficial.

Since only the surface of the inactive region is ground, a piezoelectrically active region of the component having a complicated surface is also possible.

The surface of the piezoelectrically active region comprises a roughness that promotes an adhesion of a protective layer of plastic.

Given a non-ground surface, the probability that a tear that could lead to a failure of the piezoelectric component forms at the surface is diminished compared to a ground or polished surface.

In an embodiment, the present invention provides a piezoelectric component comprising two ceramic layers with an electrode layer sandwiched therebetween, each ceramic layer comprising a lateral portion extending laterally beyond the electrode layer with an interspace disposed between the two lateral portions, the interspace accommodating an electrically insulating material.

In an embodiment, the component comprises a piezoelectrically active region and the interspace is disposed in the piezoelectrically active region.

In an embodiment, the interspace is open at one end thereof.

in an embodiment, the electrically insulating material comprises a gas.

In an embodiment, the electrically insulating material comprises a polymer.

In an embodiment, the polymer comprises a silicone elastomer.

In an embodiment, at least one of the ceramic layers comprises a lead zirconate titanate.

In an embodiment, the electrode layer comprises a substance selected from the group consisting of copper, nickel, palladium and silver.

In an embodiment, the component is a monolithic multilayer composite.

In an embodiment, the component comprises a hole and the interspace is disposed in the hole.

In an embodiment, the present invention provides a method for manufacturing a piezoelectric component comprising the following steps: (a) sintering a stack comprising two green ceramic foils and an electrode layer sandwiched therebetween; (b) removing a portion of the ceramic foils and the electrode layer at a lateral surface of the stack to provide a piezoelectrically inactive region of the stack.

In an embodiment, the removing step comprises grinding.

In an embodiment, the present invention provides an injection valve of an internal combustion engine comprising a piezoelectric component comprising two ceramic layers with an electrode layer sandwiched therebetween, each ceramic layer comprising a lateral portion extending laterally beyond the electrode layer with an interspace disposed between the two lateral portions, the interspace accommodating an electrically insulating material.

In an embodiment, the present invention provides a piezoelectric component comprising two ceramic layers each comprising lead zirconate titanate with an electrode layer sandwiched therebetween, the electrode layer comprises a substance selected from the group consisting of copper, nickel, palladium and silver, each ceramic layer comprising a lateral portion extending laterally beyond the electrode layer with an interspace disposed between the two lateral surfaces, the interspace accommodating an electrically insulating material comprising a polymer, the interspace and lateral portions of the ceramic layers forming a piezoelectrically-active region of the component.

Other objects and advantages of the present invention will become apparent upon reading the following detailed description and appended claims, and upon reference to the accompanying drawings.

BRIEF DESCRIPTION OF THE DRAWING

A piezoelectric component in the form of a monolithic piezo actuator in multi-layer structure and a manufacturing method of this component are presented below on the basis of a plurality of exemplary embodiments and the appertaining drawings. The figures are schematic and not necessarily to scale.

It should be understood that the drawings are not necessarily to scale and that the embodiments are sometimes illustrated by graphic symbols, phantom lines, diagrammatic representations and fragmentary views. In certain instances, details which are not necessary for an understanding of the invention or which render other. details difficult to perceive may have been omitted. It should be understood, of course, that the invention is not necessarily limited to the particular embodiments illustrated herein.

DETAILED DESCRIPTION OF THE PRESENTLY PREFERRED EMBODIMENTS

Figure 1:
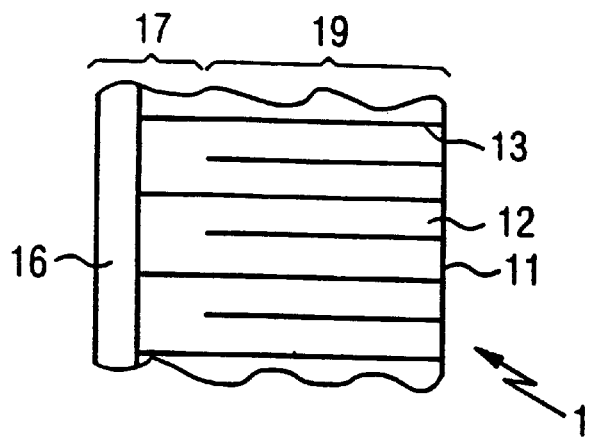
FIG. 1 is a side view of a piezo actuator in monolithic multi-layer structure.

The piezo actuator 1 is composed of a monolithic stack 11 of piezo ceramic layers 12 and electrode layers 13 arranged there between (FIG. 1). A piezo ceramic layer 12 is composed of a lead zirconate titanate. The material of an electrode layer 13 comprises a palladium-silver alloy having a ratio of palladium to silver of 30 to 70. A metalization strip 16 is applied to a lateral surface 14 of the stack 11. The metalization strip 16 is composed of a stoved silver paste. The metalization strip 16 only contacts every second electrode layer 13 of the stack 11. A piezoelectrically inactive region 17 of the stack 11 results therefrom.

Figure 3:
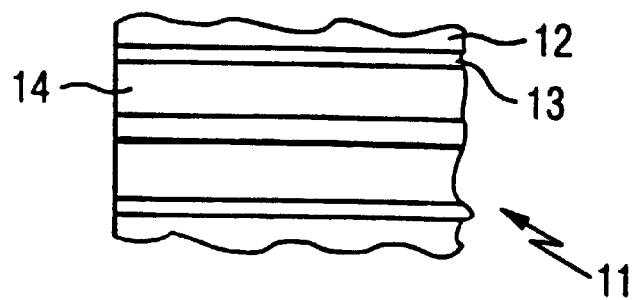
FIG. 3 is a side view of an excerpt of a piezoelectrically inactive region of a piezo actuator.

The surface 14 of the piezoelectrically inactive region 17 is ground off, i.e. the piezo ceramic layers 12 and the electrode layers 13 terminate flush at the surface 14 (FIG. 3). The layers 12 and 13 form a planar surface 14. The surface or portion 18 of the piezoelectrically active region 19 of the stack 11 is not ground. The stack 11 thus has interspaces 20 between two neighboring piezo ceramic layers 121 and 122 that are open toward their respective lateral surfaces or portions 18, 18'.

Figure 2:
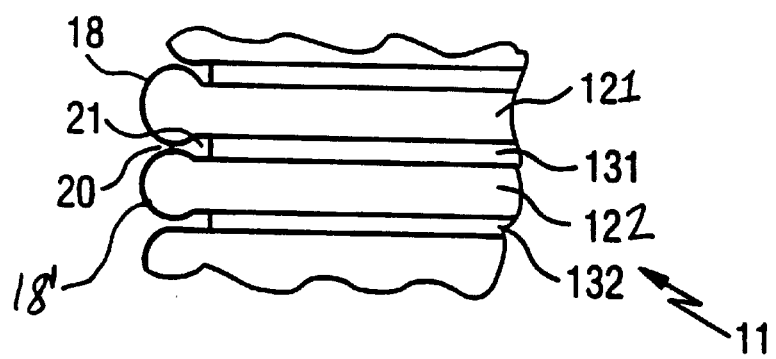
FIG. 2 is a side view of an excerpt of a piezoelectrically active region of a piezo actuator.

Such an interspace 20 is shown in FIG. 2. The interspace is filled with a silicone elastomer 21. The effective distance from electrode 131 to electrode 132 of a different polarity becomes especially great with the assistance of the interspace 20. Moreover, the silicone elastomer 21 serves as insulator. The probability of an electrical arc-over between the two electrodes 131 and 132 is thereby reduced. Likewise, the probability for an arc-over of an electrical layer 13 to an arbitrary electrode layer or an arbitrary electrical terminal of the component is diminished.

Figure 4:
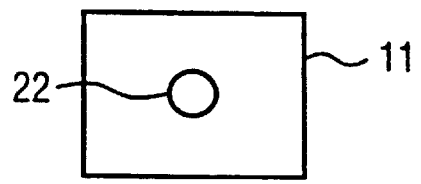
FIG. 4 is a top plan view of a piezo actuator having a hole.

Another exemplary embodiment differs from the preceding embodiment in that the stack 11 of the piezo actuator 1 has a hole 22 at which the interspace 20 is arranged (FIG. 4).

Figure 5:
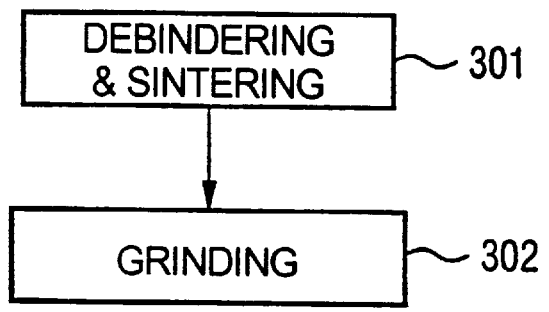
FIG. 5 is a flowchart directed to the manufacture of a piezoelectric component.
Figure 6:
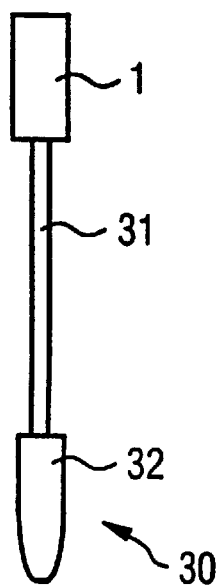
FIG. 6 is a plan view of an injection valve into which a piezo actuator is built.

FIG. 5 yields a manufacturing method of a disclosed actuator 1 in monolithic multi-layer structure. In a first method step 301, a stack of green ceramic foils and electrode layers arranged there between is debindered and sintered. In a further method step 302, only the surface 14 is ground, this being provided for an electrical contacting of the electrode layers 13. By contrast thereto, a surface 18 of the piezoelectrically active region 19 remains untreated. The grinding 302 ensues with a diamond grinding tool.

The grinding 302 can be followed by a passivation of the piezo actuator. The surface of the piezo actuator is thereby coated with a protective layer composed of a silicone elastomer. During this processing step, an interspace 20 is automatically filled with the plastic.

A piezo actuator 1 in monolithic multi-layer structure is utilized for the control of an injection valve 30 (FIG. 4) of an internal combustion engine. The piezo actuator, for example, is thereby connected to a nozzle needle 32 of the injection valve 30 via a piston 31.

From the above description it is apparent that the objects of the present invention have been achieved. While only certain embodiments have been set forth, alternative embodiments and various modifications will be apparent from the above description to those skilled in the art. These and other alternatives are considered equivalents and within the spirit and scope of the present invention.

What is claimed:

1. A piezoelectric component comprising:
two ceramic layers with an electrode layer sandwiched therebetween, each ceramic layer comprising a lateral portion extending laterally beyond the electrode layer with an interspace disposed between the two lateral portions, the interspace accommodating an electrically insulating material.

2. The component of claim 1 wherein the component comprises a piezoelectrically active region and the interspace is disposed in the piezoelectrically active region.

3. The component of claim 1 wherein the interspace is open at one end thereof.

4. The component of claim 1 whereby the electrically insulating material comprises a gas.

5. The component of claim 1 wherein the electrically insulating material comprises a polymer.

6. The component of claim 5 wherein the polymer comprises a silicone elastomer.

7. The component of claim 1 wherein at least one of the ceramic layers comprises a lead zirconate titanate.

8. The component of the claim 1 wherein the erode layer comprises a substance selected from the group consisting of copper, nickel, palladium and silver.

9. The component of claim 1 wherein the component is a monolithic multi-layer composite.

10. The component of claim 1 wherein the component comprises a hole and the interspace is disposed in the hole.

11. An injection valve of an internal combustion engine comprising:
a piezoelectric component comprising two ceramic layers with an electrode layer sandwiched therebetween, each ceramic layer comprising a lateral portion extending laterally beyond the electrode layer with an interspace disposed between the two lateral portions, the interspace accommodating an electrically insulating material.

12. A piezoelectric component comprising:
two ceramic layers each comprising lead zirconate titanate with an electrode layer sandwiched therebetween, the electrode layer comprises a substance selected from the group consisting of copper, nickel, palladium and silver, each ceramic layer comprising a lateral portion extending laterally beyond the electrode layer with an interspace disposed between the two lateral surfaces, the interspace accommodating an electrically insulating material comprising a polymer, the interspace and lateral portions of the ceramic layers forming a piezo-electrically active region of the component.

13. The component of claim 12 wherein the interspace is open at one end thereof.

14. The component of claim 12 whereby the electrically insulating material comprises a gas.

15. The component of claim 12 wherein the polymer comprises a silicone elastomer.

16. The component of claim 12 wherein the component is a monolithic multi-layer composite.

17. The component of claim 12 wherein the component comprises a hole and the interspace is disposed in the hole.

* * * * *